(12) United States Patent
Narui

(10) Patent No.: US 6,468,820 B2
(45) Date of Patent: Oct. 22, 2002

(54) PROCESS FOR FABRICATING SEMICONDUCTOR LASER EMITTING APPARATUS

(75) Inventor: Hironobu Narui, Kanagawa (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 09/794,001

(22) Filed: Feb. 28, 2001

(65) Prior Publication Data

US 2002/0022285 A1 Feb. 21, 2002

(30) Foreign Application Priority Data

Mar. 1, 2000 (JP) ........................................ 2000-055403

(51) Int. Cl.$^7$ ...................... H01L 21/00; H01L 33/00; H01S 5/00
(52) U.S. Cl. .................... 438/22; 438/42; 372/45; 372/46; 257/94
(58) Field of Search .................. 438/40–47, 22, 438/105–110, 479–485, 492, 28; 257/85, 94, 109, 191; 372/96, 45, 54

(56) References Cited

U.S. PATENT DOCUMENTS 6,055,255 A * 4/2000 Suyama et al. ............... 372/46
6,136,623 A * 10/2000 Hofstetter et al. ............ 438/28
6,175,446 B1 * 1/2001 Alphonse .................... 359/344

* cited by examiner

Primary Examiner—Matthew Smith
Assistant Examiner—Calvin Lee
(74) Attorney, Agent, or Firm—Rader, Fishman & Grauer PLLC; Ronald P. Kananen, Esq.

(57) ABSTRACT

In the fabrication of a semiconductor laser emitting apparatus which emits laser beams having two different wavelengths, surface steps of the laminate film which is formed so as to cover the first semiconductor laser emitting device and constitutes the second semiconductor laser emitting device, is removed, so that processing with high precision is realized. A process for fabricating a semiconductor laser emitting apparatus comprising first and second semiconductor laser emitting devices, which are formed on a substrate and respectively emit laser beams having different wavelengths, the process comprising: stacking a ternary-system compound semiconductor on the substrate in a region in which the first semiconductor laser emitting device is to be formed, to thereby form a first laminate; forming a second laminate comprised of a quaternary-system compound semiconductor on the substrate so that the second laminate covers the first laminate; planarizing the surface of the second laminate so that the surface of the first laminate is exposed to the outside; forming current injection regions in the cladding layer; forming a current constriction region; and separating the first laminate from the second laminate, to thereby form a space between the laminates.

2 Claims, 4 Drawing Sheets

PROCESS FOR FABRICATING SEMICONDUCTOR LASER EMITTING APPARATUS

BACKGROUND OF THE INVENTION

1. Field of the Invention

The present invention relates to a process for fabricating a semiconductor laser emitting apparatus. More particularly, the present invention is concerned with a process for fabricating a semiconductor laser emitting apparatus which emits laser beams having two different wavelengths.

2. Description of the Related Art

A conventional process for fabricating a semiconductor laser emitting apparatus which emits laser beams having two different wavelengths is described below with reference to diagrammatic cross-sectional views of FIGS. 2A to 2H illustrating the fabrication process.

As shown in FIG. 2A, on an n-type substrate 110 comprised of GaAs, a first n-type buffer layer 131 comprised of GaAs, a first n-type cladding layer 132 comprised of AlGaAs, a first active layer (having a multiple quantum well (MQW) structure having an oscillation wavelength of 780 nm) 133, a first p-type cladding layer 134 comprised of AlGaAs, and a first p-type cap layer 135 comprised of GaAs are stacked on one another in this order by a metal organic vapor phase epitaxial growth (hereinafter, frequently referred to simply as "MOVPE") method.

Then, as shown in FIG. 2B, a resist film (not shown) is formed so that it covers a region 121 in which a first semiconductor laser emitting device is to be formed (first semiconductor laser emitting device formation region 121), and the layers of from the first p-type cap layer 135 to the first n-type cladding layer 132, excluding the portion corresponding to the first semiconductor laser emitting device formation region 121, are removed using the above resist film as-a mask by a wet etching process, such as a sulfuric acid system non-selective etching process and a hydrofluoric acid (HF) system selective etching process for AlGaAs, to thereby form, in the first semiconductor laser emitting device formation region 121, a first laminate 123 in which the first p-type cap layer 135, the first p-type cladding layer 134, the first active layer 133, and the first n-type cladding layer 132 are stacked on one another.

Subsequently, as shown in FIG. 2C, on the first n-type buffer layer 131, a second n-type buffer layer 136 comprised of InGaP, a second n-type cladding layer 137 comprised of AlGaInP, a second active layer (having a multiple quantum well (MQW) structure having an oscillation wavelength of 650 nm) 138, a second p-type cladding layer 139 comprised of AlGaInP, and a second p-type cap layer 140 comprised of GaAs are stacked on one another in this order by a MOVPE method so that they cover the first laminate 123.

Then, as shown in FIG. 2D, a resist film (not shown) is formed so that it covers a region 122 in which a second semiconductor laser emitting device is to be formed (second semiconductor laser emitting device formation region 122). The layers of from the second p-type cap layer 140 to the second n-type buffer layer 136, excluding the portion corresponding to the second semiconductor laser emitting device formation region 122, are removed using the above resist film as a mask by a wet etching process, such as a sulfuric acid system etching process for a cap layer and a phosphoric acid and hydrochloric acid system selective etching process for a quaternary-system compound semiconductor, and a hydrochloric acid system separation etching process, to thereby form, in the second semiconductor laser emitting device formation region 122, a second laminate 124 in which the second n-type buffer layer 136, the second n-type cladding layer 137, the second active layer 138, the second p-type cladding layer 139, and the second p-type cap layer 140 are stacked on one another. As a result, the first laminate 123 and the second laminate 124 are separated from each other.

Subsequently, as shown in FIG. 2E, insulating films 125 are formed on the first laminate 123 and the second laminate 124 so that they cover portions which are to be current injection regions, and then, for forming a stripe structure which is to be a current constriction structure of a gain guide type, from surfaces of the first p-type cap layer 135 and the second p-type cap layer 140 to halfway portions of the first p-type cladding layer 134 and the second p-type cladding layer 139 are respectively processed in a ridge form in a certain depth of the first p-type cladding layer 134 and the second p-type cladding layer 139 by an etching process using the insulating films 125 as a mask.

Then, as shown in FIG. 2F, an n-type layer 141 comprised of, for example, GaAs is allowed to selectively grow on the compound semiconductor layer, so that it implants the portions etched in a ridge form in the first p-type cladding layer 134 and the second p-type cladding layer 139.

Then, the insulating films 125 are removed by an etching process. Subsequently, as shown in FIG. 2G, a resist film (not shown) is formed so that it covers only the portions of the n-type layer 141 formed on the first laminate 123 and the second laminate 124, and then, the n-type layer 141 is removed by an etching process using the above resist film as a mask so that the only portions of the n-type layer 141 on the first laminate 123 and the second laminate 124 remain.

Then, as shown in FIG. 2H, the resist film is removed. Further, a first p-type electrode 143 and a second p-type electrode 144 respectively connected to the first p-type cap layer 135 and the second p-type cap layer 140 are formed from, for example, a Ti/Pt/Au laminate, and an n-type electrode 151 connected to the n-type substrate 110 is formed from, for example, a AuGe/Ni/Au laminate.

However, in the step for separating the first semiconductor laser emitting device comprising the first laminate from the second semiconductor laser emitting device comprising the second laminate, an exposure step for a resist film which serves as a mask for etching is inevitably performed in a state such that the surface step of the layer directly under the resist film is large. Therefore, it has been difficult to achieve the patterning for resist with precision.

In addition, it is necessary that the step for separating the first semiconductor laser emitting device comprising the first laminate from the second semiconductor laser emitting device comprising the second laminate by an etching process, and the step for separating the n-type layer which constitutes the current constriction layer by an etching process be separately conducted in two different separation steps. Therefore, a burden on the process has been large.

SUMMARY OF THE INVENTION

The present invention is a process for fabricating a semiconductor laser emitting apparatus which has been made for solving the above-mentioned problems accompanying the prior art.

The process of the present invention is a process for fabricating a semiconductor laser emitting apparatus comprising a first semiconductor laser emitting device and a second semiconductor laser emitting device, which are formed on a substrate and respectively oscillate laser beams having different wavelengths, the process comprising the steps of: stacking on the substrate a compound semiconductor layer which constitutes the first semiconductor laser emitting device, to thereby form a first laminate; removing the first laminate so that the portion of the first laminate in a region in which the first semiconductor laser emitting device is to be formed remains; stacking on the substrate a compound semiconductor layer which constitutes the second semiconductor laser emitting device, to thereby form a second laminate; removing the second laminate formed on the first laminate, to thereby expose a surface of the first laminate to the outside and planarize a surface of the second laminate; forming current injection regions in a ridge form in the first and second laminates, respectively; selectively forming a current constriction layer on the portion of the first and second laminates other than the current injection regions; and forming a space in the current constriction layer and between the first laminate and the second laminate, to thereby separate the first laminate from the second laminate.

The process for fabricating a semiconductor laser emitting apparatus of the present invention includes a step for removing the second laminate formed on the first laminate, to thereby expose the surface of the first laminate to the outside and planarize the surface of the second laminate. Therefore, in the subsequent step for separating the first laminate from the second laminate, to thereby form a space between the laminates, an exposure step for a resist film which serves as a mask for etching can be performed in a state such that the surface of the layer directly under the resist film is planarized, so that patterning for resist can be conducted with high precision, enabling the separation to be achieved with high precision.

In addition, in the process of the present invention, the step for separating the first laminate from the second laminate, to thereby form a space between the laminates, and the step for separating the current constriction layer by an etching process are conducted in the same separation step. Therefore, a burden on the process can be reduced.

BRIEF DESCRIPTION OF THE DRAWINGS

The foregoing and other objects, features and advantages of the present invention will be apparent to those skilled in the art from the following description of the presently preferred exemplary embodiments of the invention taken in connection with the accompanying drawings, in which.

DETAILED DESCRIPTION OF THE PREFERRED EMBODIMENT

Figure 1A:
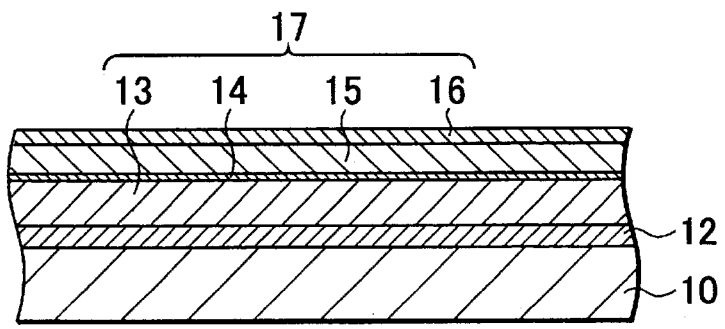
FIGS. 1A to 1H are diagrammatic cross-sectional views illustrating a process for fabricating a semiconductor laser emitting apparatus according to one embodiment of the present invention.

The semiconductor laser emitting apparatus according to one embodiment of the present invention is described below with reference to the diagrammatic cross-sectional views of FIGS. 1A to 1H illustrating the fabrication process. The thickness of layers is not limited to that shown in the drawings, but may be varied within the scope of the invention.

As shown in FIG. 1A, a first n-type buffer layer 12 is formed on a substrate 10 by an epitaxial growth method, such as a MOVPE method. Then, on the first n-type buffer layer 12, a first n-type cladding layer 13 as a first conductive cladding layer, a first active layer 14 having a multiple quantum well (MQW) structure having an oscillation wavelength of 780 nm, a first p-type cladding layer 15 as a second conductive cladding layer, and a first p-type cap layer 16 are stacked on one another in this order, to thereby form a first laminate 17. In the present embodiment, the first conductive cladding layer is an n-type cladding layer and the second conductive cladding layer is a p-type cladding layer. However, any other modification may be available within the scope of the invention. As the substrate 10, for example, an n-type GaAs substrate is used, and the first n-type buffer layer 12 is formed from, for example, an n-type GaAs layer. The first n-type cladding layer 13 is formed from, for example, an n-type AlGaAs layer, and the first p-type cladding layer 15 is formed from, for example, a p-type AlGaAs layer. The first p-type cap layer 16 is formed from, for example, a p-type Gays layer. Guide layers may be formed between the first active layer 14 and the first n-type cladding layer 13 and between the first active layer 14 and the first p-type cladding layer 15.

Figure 1B:
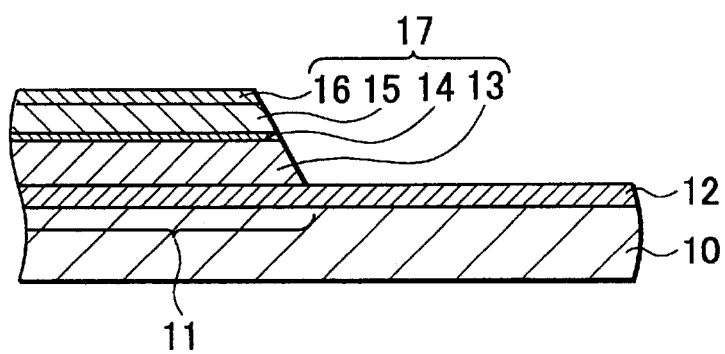

Then, as shown in FIG. 1B, a resist film (not shown) is formed so that it covers a region 11 in which a first semiconductor laser emitting device is to be formed (first semiconductor laser emitting device formation region 11), and then, the layers of from the first p-type cap layer 16 to the first n-type cladding layer 13, excluding the portion corresponding to the first semiconductor laser emitting device formation region 11, are removed using the above resist film as a mask by a wet etching process, such as a sulfuric acid system non-selective etching process and a hydrofluoric acid (HF) system selective etching process for AlGaAs. As a result, in the first semiconductor laser emitting device formation region 11, the first laminate 17 in which the first n-type cladding layer 13, the first active layer 14, the first p-type cladding layer 15, and the first p-type cap layer 16 are stacked on one another in this order remains.

Figure 1C:
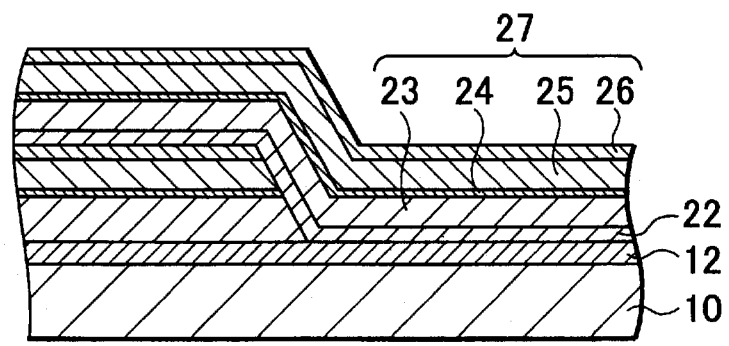

Subsequently, as shown in FIG. 1C, for example, on the first n-type buffer layer 12, a second n-type buffer layer 22, a second n-type cladding layer 23 as a first conductive layer, a second active layer 24 having a multiple quantum well (MQW) structure having an oscillation wavelength of 650 nm, a second p-type cladding layer 25 as a second conductive layer, and a second p-type cap layer 26 are stacked on one another in this order by an epitaxial growth method, for example, a MOVPE method, to thereby form a second laminate 27. The second n-type buffer layer is formed from, for example, an n-type InGaP layer, and the second n-type cladding layer 23 is formed from, for example, an n-type AlGaInP layer. The second p-type cladding layer 25 is formed from, for example, a p-type AlGaInP layer, and the second p-type cap layer 26 is formed from, for example, a p-type GaAs layer.

Figure 1D:
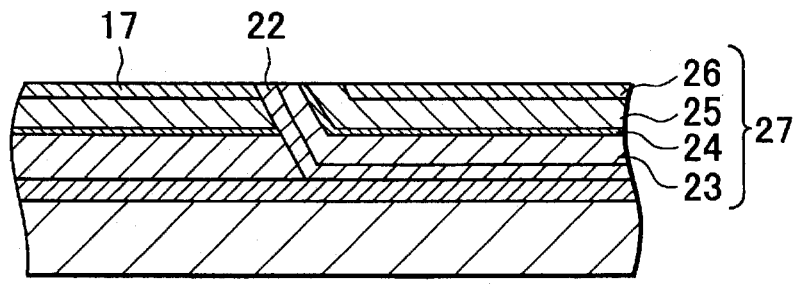

Then, a planarization film (not shown) is formed on the second laminate 27 from, for example, a resist, and then, an etching process for planarization (etch back) is performed so that the uppermost surface of the first laminate 17 is exposed to the outside. As a result, as shown in FIG. 1D, the second laminate 27 comprising the second n-type buffer layer 22, the second n-type cladding layer 23, the second active layer 24, the second p-type cladding layer 25, and the second p-type cap layer 26 is planarized, and the uppermost surface of the first laminate 17 is exposed to the outside.

Figure 1E:
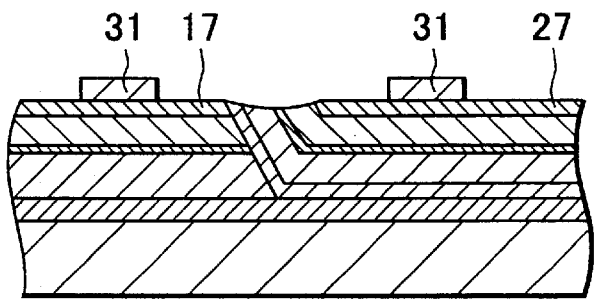

Next, as shown in FIG. 1E, insulating films 31 are formed on the first laminate 17 and the second laminate 27 so that they cover portions which are to be current injection regions.

Figure 1F:
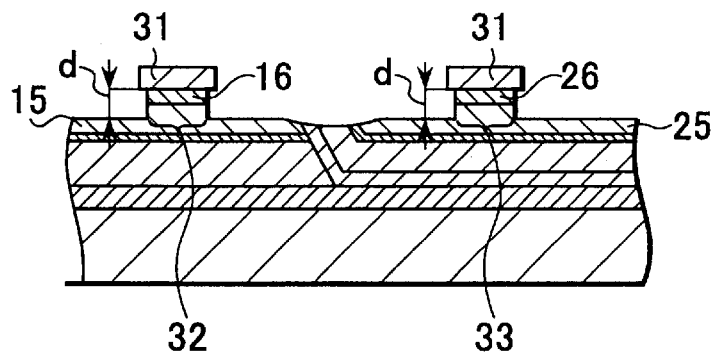

Then, as shown in FIG. 1F, for forming a stripe structure which is to be a current constriction structure of a gain guide type, for example, from surfaces of the first p-type cap layer 16 and the second p-type cap layer 26 to halfway portions of the first p-type cladding layer 15 and the second p-type cladding layer 25 are respectively processed in a ridge form in a certain depth of the first p-type cladding layer 15 and the second p-type cladding layer 25 by an etching process using the insulating films 31 as a mask. The resultant regions processed in a ridge form become current injection regions 32, 33. By changing the depth d for etching, the stripe structure can be of either a gate guide type or an index guide type.

Figure 1G:
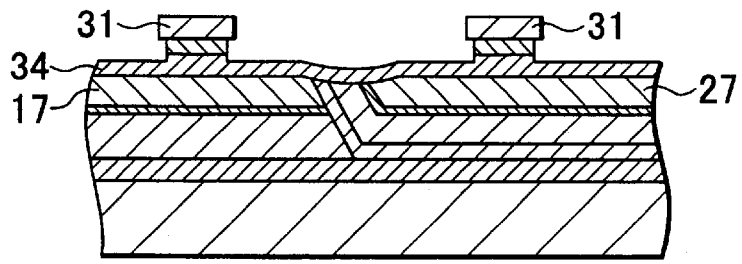

Subsequently, as shown in FIG. 1G, on the exposed first and second laminates 17, 27, for example, an n-type layer is allowed to selectively grow by a selective growth method using the insulating films 31 as a mask, to thereby form a current constriction layer 34. In this embodiment, the current constriction layer 34 is formed from, for example, an n-type GaAs layer.

Figure 1H:
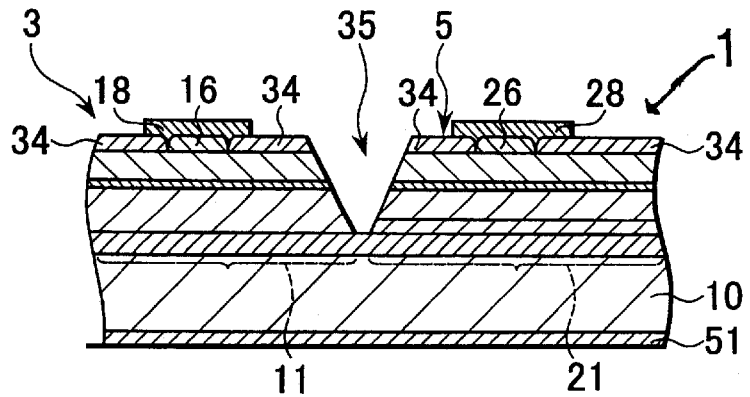
Figure 2A:
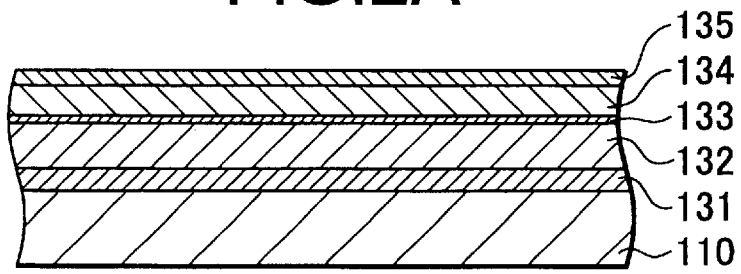
FIGS. 2A to 2H are diagrammatic cross-sectional views illustrating a conventional process for fabricating a semiconductor laser emitting apparatus.
Figure 2B:
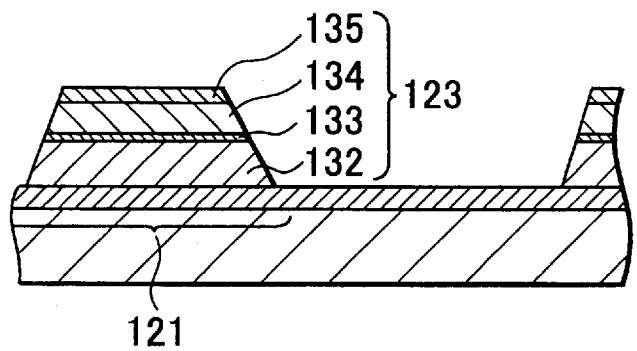
Figure 2C:
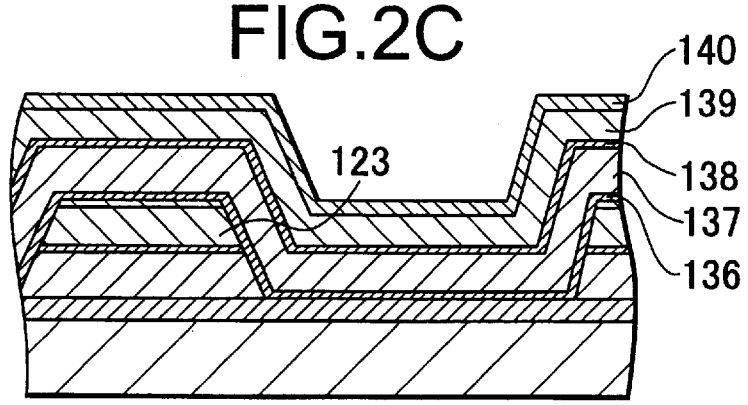
Figure 2D:
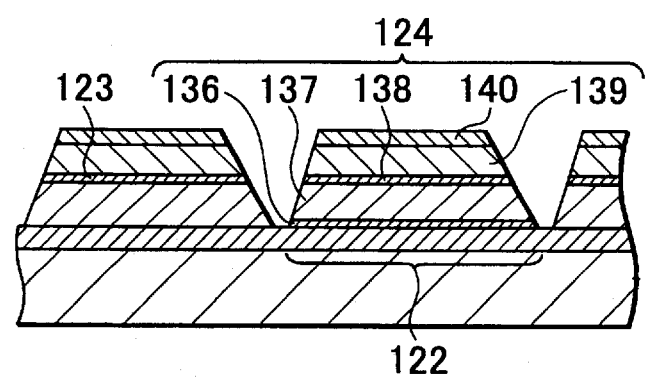
Figure 2E:
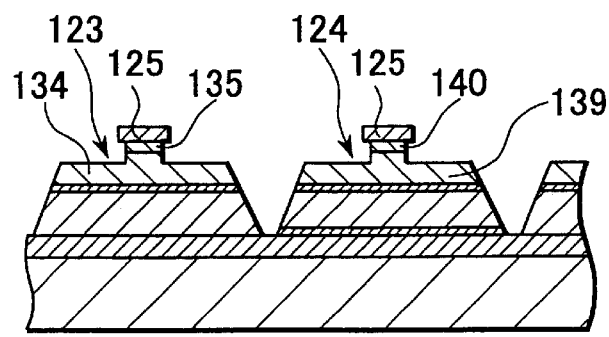
Figure 2F:
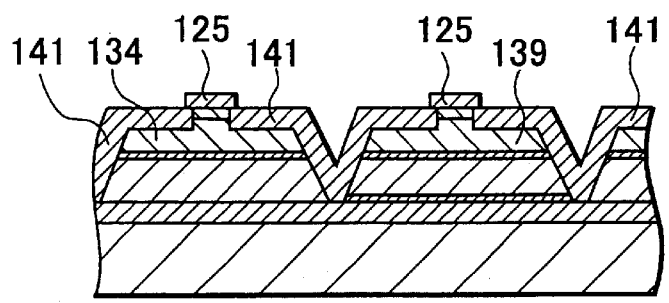
Figure 2G:
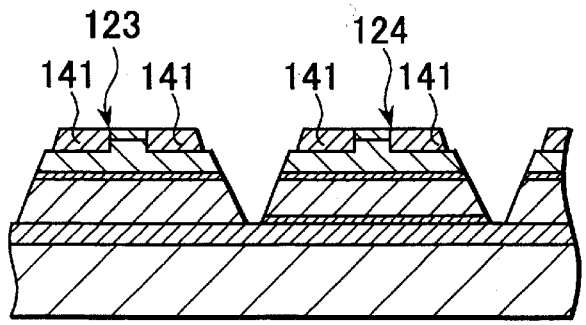
Figure 2H:
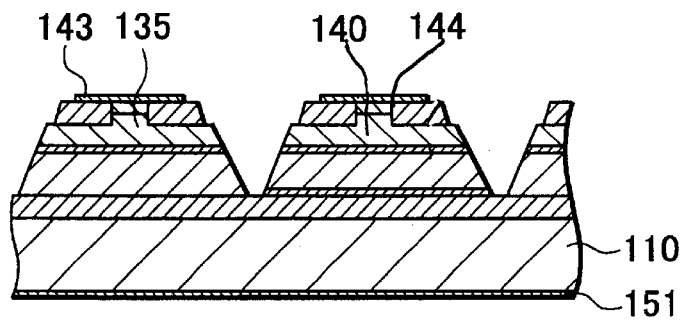

Then, the insulating films 31 are removed by an etching process. Subsequently, as shown in FIG. 1H, a resist film (not shown) is formed so that it covers the current constriction layer 34, the first and second p-type cap layers 16, 26 and the like, and then, the resist film is subjected to patterning by a lithography technique, to thereby form a resist film (not shown) which covers the first semiconductor laser emitting device formation region 11 and a second semiconductor laser emitting device formation region 21 in which first and second semiconductor laser emitting devices are to be respectively formed.

The portion of the second laminate 27 up to the second n-type buffer layer 22, excluding the portion corresponding to the second semiconductor laser emitting device formation region 21, is removed using the above resist film as a mask by a wet etching process, such as an etching process for the current constriction layer 34 using an ammonia etching liquid and a selective etching process for a quaternary-system compound semiconductor using a phosphoric acid and hydrochloric acid etching liquid, and a hydrochloric acid system separation etching process. As a result, a space 35 is formed between a first semiconductor laser emitting device 3 mainly comprised of the first laminate 17 and a second semiconductor laser emitting device 5 mainly comprised of the second laminate 27, so that the first semiconductor laser emitting device 3 and the second semiconductor laser emitting device 5 are separated from each other.

Then, the resist film is removed. Further, a first p-type electrode 18 connected to the first p-type cap layer 16 is formed from, for example, a Ti/Pt/Au laminate, and a second p-type electrode 28 connected to the second p-type cap layer 26 is formed from, for example, a Ti/Pt/Au laminate. Furthermore, an n-type electrode 51 connected to the substrate 10 is formed from, for example, an AuGe/Ni/Au laminate.

Thus, a semiconductor laser emitting apparatus 1 having mounted on the same chip the first semiconductor laser emitting device 3 which mainly comprises the first laminate 17 and the second semiconductor laser emitting device 5 which mainly comprises the second laminate 27 is completed.

The process for fabricating the semiconductor laser emitting apparatus 1 contains a step for removing the second laminate 27 formed on the first laminate 17, to thereby expose the surface of the first laminate 17 to the outside and planarize the surface of the second laminate 27. Therefore, in the subsequent step for separating the first laminate 17 from the second laminate 27, to thereby form the space 35 between the laminates, an exposure step for the resist film (not shown) which serves as a mask for etching can be performed in a state such that the surface of the layer directly under the resist film is planarized, so that patterning for resist can be conducted with high precision, enabling the separation to be achieved with high precision.

As mentioned above, the process for fabricating a semiconductor laser emitting apparatus of the present invention includes a step for removing the second laminate formed on the first laminate, to thereby expose the surface of the first laminate to the outside and planarize the surface of the second laminate. Therefore, in the subsequent step for separating the first laminate from the second laminate, to thereby form a space between the laminates, an exposure step for a resist film which serves as a mask for etching can be performed in a state such that the surface of the layer immediately under the resist film is planarized, so that patterning for resist can be conducted with high precision. Thus, it is possible to separate the ternary-system compound semiconductor region from the quaternary-system compound semiconductor region with high precision. In addition, in the process of the present invention, the step for separating the first laminate from the second laminate, to thereby form a space between the laminates, and the step for separating the insulating layer which constitutes the current constriction layer by an etching process are conducted in the same separation step. Therefore, a burden on the process can be reduced.

What is claimed is:

1. A process for fabricating a semiconductor laser emitting apparatus comprising a first semiconductor laser emitting device and a second semiconductor laser emitting device, which are formed on a substrate and respectively oscillate laser beams having different wavelengths, said process comprising the sequential steps of:

stacking on said substrate a compound semiconductor layer which constitutes said first semiconductor laser emitting device to form a first laminate;

removing said first laminate so that a portion of said first laminate in a region in which said first semiconductor laser emitting device is to be formed remains by covering said portion of said first laminate with a film;

stacking on said substrate and said first laminate a compound semiconductor layer which constitutes said second semiconductor laser emitting device to form a second laminate;

removing said second laminate formed on said first laminate to expose a surface of said first laminate and planarize said second laminate, so as to not separate the first and second laminates;

forming a current injection region in a ridge form on said first and second laminates;

selectively forming a current constriction layer on a portion of said first and second laminates other than said current injection regions on said first and second laminates; and forming a space in said current constriction layer and between said first second laminates, thereby separating said first laminate from said second laminate.

2. A process for fabricating a semiconductor laser emitting apparatus, comprising the sequential steps of:

forming a first laminate on a substrate by stacking a compound semiconductor layer which constitutes a first semiconductor laser emitting device;

selectively removing said first laminate in a region in which said first semiconductor laser emitting device is to be formed;

forming a second laminate on said substrate and said first laminate by stacking a compound semiconductor layer which constitutes a second semiconductor laser emitting device;

covering said second laminate with a film and selectively removing said second laminate formed on said first laminate to expose an uppermost surface of said first laminate and to planarize said second laminate formed on said substrate, so as to not separate the first and second laminates;

forming a current injection region on each of said first and second laminates;

selectively forming a current constriction layer on a portion of said first and second laminates other than said current injection regions; and forming a space in said current constriction layer and between said first laminate and said second laminate to separate said first laminate from said second laminate.

* * * * *

UNITED STATES PATENT AND TRADEMARK OFFICE
CERTIFICATE OF CORRECTION

PATENT NO. : 6,468,820 B2
DATED : October 22, 2002
INVENTOR(S) : Hironobu Narui

It is certified that error appears in the above-identified patent and that said Letters Patent is hereby corrected as shown below:

<u>Column 6,</u>
Line 60, "forming a space in said current constriction layer and" should read -- forming a space in said current constriction layer and our --
Line 61, "between said first second laminates, thereby separating" should read -- between said first and second laminates, thereby separating --.

Signed and Sealed this

Twelfth Day of August, 2003

JAMES E. ROGAN
*Director of the United States Patent and Trademark Office*